US007006551B2

(12) United States Patent
Gruhlke et al.

(10) Patent No.: US 7,006,551 B2
(45) Date of Patent: Feb. 28, 2006

(54) METHOD OF ENHANCING WAVELENGTH TUNING PERFORMANCE IN AN EXTERNAL CAVITY LASER

(75) Inventors: Russell W. Gruhlke, Fort Collins, CO (US); Charles D. H ke, Menlo Park, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 150 days.

(21) Appl. No.: 10/651,747

(22) Filed: Aug. 29, 2003

(65) Prior Publication Data

US 2005/0047473 A1    Mar. 3, 2005

(51) Int. Cl.
*H01S 3/10* (2006.01)
(52) U.S. Cl. .................. 372/102; 372/20; 372/101
(58) Field of Classification Search .............. 372/20, 372/98, 101, 102
See application file for complete search history.

(56) References Cited

U.S. PATENT DOCUMENTS

| 5,386,426 | A | * | 1/1995 | Stephens ................. 372/20 |
| 5,526,338 | A | * | 6/1996 | Hasman et al. ........... 369/94 |
| 5,926,318 | A | * | 7/1999 | Hebert .................. 359/618 |
| 5,966,399 | A | * | 10/1999 | Jiang et al. ............. 372/96 |
| 5,982,806 | A | * | 11/1999 | Yamaguchi et al. ....... 372/103 |
| 6,829,258 | B1 | * | 12/2004 | Carlisle et al. ........... 372/20 |
| 6,834,036 | B1 | * | 12/2004 | Shiono et al. ......... 369/112.03 |

FOREIGN PATENT DOCUMENTS

EP          02017446.2         8/2002

OTHER PUBLICATIONS

Hecht, Eugene, "Optics," 2nd Ed., Addison-Wesley Publishing Company, Reading, MA, p. 424-430, (May , 1990).
Cassidy, Daniel T., and Hamp, Michael J., "Diffractive optical element used in an external feedback configuration to tune the wavelength of uncoated Fabry-Perot diode lasers," Journal of Modern Optics, vol. 46, No. 7, p. 1071-1078, (1999).
Gruhlke, Russell W., "Wavelength Tuning an External Cavity Laser Without Mechanical Motion," Aug. 2003.
Hoke, Charles D. et al., "External Cavity Laser in Which Diffractive Focusing is Confined to a Peripheral Portion of a Diffractive Focusing Element," Aug. 2003.
Gruhlke, Russell W., "Using Relay Lens to Enhance Optical Performance of an External Cavity Laser," Aug. 2003.

* cited by examiner

*Primary Examiner*—James Vannucci (57) ABSTRACT

A method of enhancing wavelength tuning performance in an external cavity laser includes providing a diffractive focusing element, emitting light into the cavity of the laser at a range of angles relative to an optical axis of the cavity, and diffractively focusing the light back onto the optical axis at a wavelength-dependent focal distance using the diffractive focusing element. The method further includes confining the diffractive focusing to a high dispersivity portion of the diffractive focusing element. In various embodiments, the confining may include offsetting the diffractive focusing element radially relative to the optical axis, or selectively blocking a portion of the light emitted into the cavity at emission angles less than a threshold emission angle.

18 Claims, 7 Drawing Sheets

METHOD OF ENHANCING WAVELENGTH TUNING PERFORMANCE IN AN EXTERNAL CAVITY LASER

CROSS-REFERENCE TO RELATED APPLICATIONS

This application is related to concurrently filed, co-pending and commonly assigned U.S. patent application Ser. No. 10/651,401, titled "EXTERNAL CAVITY LASER IN WHICH DIFFRACTIVE FOCUSING IS CONFINED TO A PERIPHERAL PORTION OF A DIFFRACTIVE FOCUSING ELEMENT"; concurrently filed, co-pending and commonly assigned U.S. patent application Ser. No. 10/651,737, titled "USING RELAY LENS TO ENHANCE OPTICAL PERFORMANCE OF AN EXTERNAL CAVITY LASER"; concurrently filed, co-pending and commonly assigned U.S. patent application Ser. No. 10/651,677, titled "WAVELENGTH TUNING AN EXTERNAL CAVITY LASER WITHOUT MECHANICAL MOTION"; and co-pending and commonly assigned European Patent Application No. 02 017 446.2, titled "WAVELENGTH TUNABLE LASER WITH DIFFRACTIVE OPTICAL ELEMENT," filed Aug. 3, 2002, the disclosures of all of which are hereby incorporated herein by reference.

TECHNICAL FIELD

This invention relates to external cavity lasers and particularly to a method of enhancing wavelength tuning performance in an external cavity laser by confining diffractive focusing to a peripheral portion of a diffractive focusing element.

BACKGROUND OF THE INVENTION

External cavity lasers can exhibit an important advantage of wavelength tuning over large wavelength ranges. Wavelength tuning in an external laser cavity depends on the dispersion of light resonating within the cavity. Diffractive focusing elements are incorporated in some external cavity laser designs. In these cases, the dispersion of light either transmitted through or reflected from the diffractive focusing element enables a significant range of wavelength tuning.

BRIEF SUMMARY OF THE INVENTION

In accordance with the invention, a method of enhancing wavelength tuning performance in an external cavity laser is provided. The method includes providing a diffractive focusing element, emitting light into the cavity of the laser at a range of angles relative to an optical axis of the cavity, and diffractively focusing the light back onto the optical axis at a wavelength-dependent focal distance using the diffractive focusing element. The method further includes confining the diffractive focusing to a high dispersivity portion of the diffractive focusing element. In various embodiments, the confining may include offsetting the diffractive focusing element radially relative to the optical axis, or selectively blocking a portion of the light emitted into the cavity at emission angles less than a threshold emission angle.

DETAILED DESCRIPTION OF THE INVENTION

The well-known grating equation (see for example E. Hecht, Optics, Second Edition, Addison-Wesley Publishing Company, 1990, pp. 424–430) can be written:

$$\pm m\lambda_i = \Lambda[\sin \alpha_m - \sin \alpha_i], \quad (1)$$

where $\lambda_i$ is the wavelength of diffracted light, m is the diffractive order, $\Lambda$ is the periodicity of the diffractive profile of the diffractive element, $\alpha_i$ is the angle between the propagation direction of incident light and the normal to the diffractive surface, and $\alpha_m$ is the angle between the diffracted propagation direction and the normal to the diffractive surface. Dispersion, which is defined as the incremental difference in diffracted angle corresponding to an incremental difference in wavelength is given by the expression:

$$\text{Dispersion} = d\alpha_m/d\lambda_i = m/\Lambda \cos \alpha_m. \quad (2)$$

In other words, in any given diffractive order m, dispersion increases with decreasing periodicity $\Lambda$ and with increasing diffracted angle $\alpha_m$.

An external cavity laser includes an optical gain medium capable of emitting light over a range of wavelengths and angles propagating in the cavity of the external cavity laser. Some external cavity lasers incorporate a diffractive focusing element having an axis of symmetry coincident with the optical axis of the optical gain medium. The diffractive focusing element contains a central radial portion and a peripheral radial portion, and is capable of diffractively focusing the propagating light back into the optical gain medium at differing wavelength-dependent focal distances. The peripheral radial portion of a diffractive focusing element diffracts light with greater dispersion than does the central radial portion of the same diffractive focusing element. Expressed in other words, the central radial portion of a diffractive focusing element has a dispersivity less than a threshold, whereas the peripheral radial portion of the same diffractive focusing element has a dispersivity greater than the same threshold, where dispersivity as defined herein is an optical property of a diffractive element that denotes the capability of the diffractive element to disperse light.

Wavelength tuning in an external laser cavity depends on the dispersion of light resonating within the cavity. Thus, since the peripheral radial portion of a diffractive focusing element has greater dispersivity than does the central radial portion of that element, light diffracted by the peripheral radial portion provides greater effective wavelength tuning performance, whereas light diffracted by the central radial portion undergoes relatively lower dispersion and consequently provides reduced effective wavelength tuning performance of the external cavity laser. For traditional external cavity lasers containing on-axis diffractive focusing elements, most of the light resonating within the cavity is diffractively focused by the central radial portion of the diffractive element, where it undergoes lower dispersion than does light diffractively focused by the peripheral radial portion of the diffractive element.

Figure 1A:
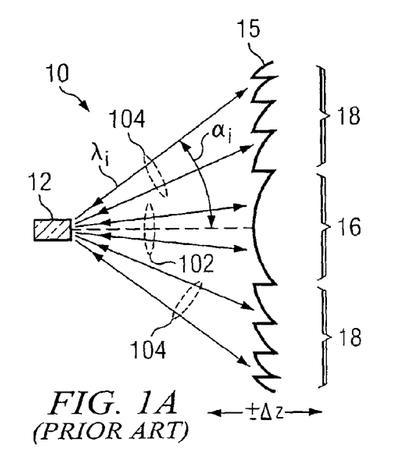
FIGS. 1A and 1B are cross-sectional views through the diameters of on-axis reflective and transmissive diffractive focusing elements, respectively, in traditional external cavity lasers.
Figure 1B:
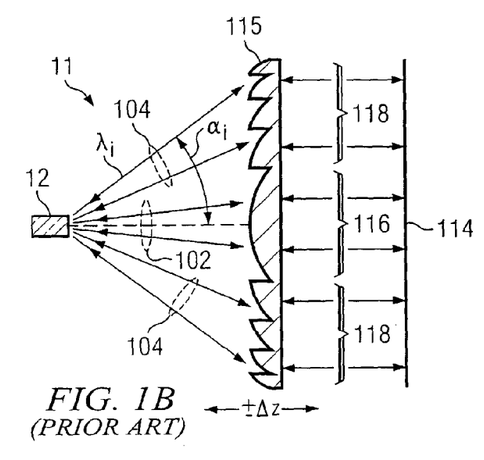

FIGS. 1A and 1B are cross-sectional views through the diameters of on-axis reflective and transmissive diffractive focusing elements 15 and 115, respectively, in traditional external cavity lasers 10, 11. In traditional external cavity laser 10 with reflective geometry, light is emitted by an optical gain medium, e.g., diode emitter 12, which is capable of emitting light 102, 104 over a range of wavelengths $\lambda_i$ and angles $\alpha_i$. As depicted in FIG. 1A, emitted light is incident on reflective diffractive focusing element 15, which then diffractively focuses the reflected light back along the same path as the emitted light into optical gain medium 12. The light diffractively focused back into optical gain medium 12 undergoes dispersion at reflective diffractive focusing element 15, such that the most strongly reflected wavelength $\lambda_i$ at angle of incidence $\alpha_i$ of the light at reflective diffractive focusing element 15 depends on the angle of incidence $\alpha_i$. In particular, in order to be focused back into optical gain medium 12, light of wavelength $\lambda_i$ at angle of incidence $\alpha_i$ is locally diffracted through a diffracted angle $\alpha_m$, in accordance with the grating equation (1).

With the diffractive profile of diffractive element 15 appropriately configured, the diffraction efficiency into the first diffractive order (m=1) is maximized (e.g., 80–100 percent). Additionally, diffractive element 15 is contoured such that periodicity $\Lambda$ is smaller in peripheral radial portion 18 and larger in central radial portion 16 of reflective diffractive focusing element 15. Accordingly, light 104 is diffracted by peripheral radial portion 18 at larger diffracted angles $\alpha_m$ than light 102 diffracted by central radial portion 16. The refocusing property of diffractive element 15 requires that $\alpha_m = -\alpha_i$. Therefore, light diffracted by peripheral radial portion 18 undergoes correspondingly greater dispersion than light diffracted by central radial portion 16.

A traditional external cavity laser with transmissive geometry functions in a manner similar to that described above for reflective geometry. In the example of external cavity laser 11 depicted in FIG. 1B, light 102, 104 emitted from optical gain medium 12 is typically transmissively collimated by transmissive diffractive focusing element 115 and is then reflected by primary reflector 114 back through transmissive diffractive focusing element 115, which subsequently refocuses the light back into gain medium 12. In a first pass through transmissive diffractive focusing element 115, light of wavelength $\lambda_i$ at incident angle $\alpha_i$ is diffracted to propagate transmissively normal to the diffractive focusing element surface, and in a second pass is again diffracted through an angle $\alpha_i$, thus undergoing a round-trip diffracted angle of $(2\alpha_i)$, consistent with the refocusing property, and undergoing dispersion in accordance with equation (2). Additionally, light transmitted through the transmissive substrate of diffractive focusing element 115 undergoes a slight amount of dispersion that is negligible compared with that caused by the diffractive surface profile of diffractive element 115. Accordingly, the dispersion occurring in the transmissive geometry illustrated in the example shown in FIG. 1B is substantially equivalent to the dispersion occurring in the reflective geometry depicted in FIG. 1A. Light 104 is similarly diffracted by peripheral radial portion 118 with greater dispersion than light 102 diffracted by central radial portion 116.

Wavelength tuning in external cavity lasers 10, 11 is accomplished traditionally by moving diffractive focusing element 15, 115 axially relative to gain medium 12, as indicated by directional arrows labeled $\pm \Delta z$ in FIGS. 1A and 1B (see for example Bourzeis et al., U.S. Pat. No. 6,324,193, issued Nov. 27, 2001; also D. T. Cassidy et al., Modem Optics, Vol. 46, Section 7, 1999, pp. 1071–1078). The surface profiles of diffractive focusing elements 15, 115 are contoured, such that incident light of a particular wavelength at each radial position is directed to a common focal position. However, because of the dispersivity of diffractive focusing elements 15, 115, light of different wavelengths is focused at different distances axially from respective diffractive element 15, 115. Relative motion of the diffractive focusing element causes diffracted light of varying wavelengths to focus back into gain medium 12 and thereby to resonate selectively within respective external cavity laser 10, 11.

In accordance with the invention, a greater portion of the light resonant within the cavity is confined to be diffractively focused by the peripheral radial portion rather than by the central radial portion of the diffractive focusing element. Since dispersion occurring at the diffractive focusing element peripheral radial portion is larger than that occurring at the central radial portion, light resonant within the cavity undergoes relatively more dispersion. Reducing the amount of light diffracted by the central radial portion of the diffractive focusing element relative to that diffracted by the peripheral radial portion of the diffractive focusing element increases the effective dispersion of light resonating within the cavity, and thus enhances the wavelength tuning performance of the external cavity laser. In particular, the spectral response of the cavity narrows. This reduces the number of modes competing for resonance within the cavity.

Figure 2A:
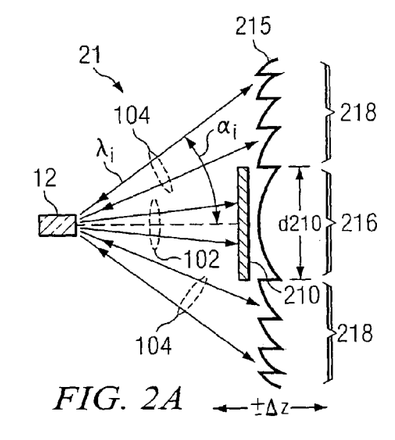
FIGS. 2A and 2B are cross-sectional views through the diameters of on-axis reflective and transmissive diffractive focusing elements, respectively, in external cavity lasers, illustrating techniques in accordance with the invention to confine a greater amount of diffracted light to peripheral radial portions relative to central radial portions of the respective diffractive focusing elements.
Figure 2B:
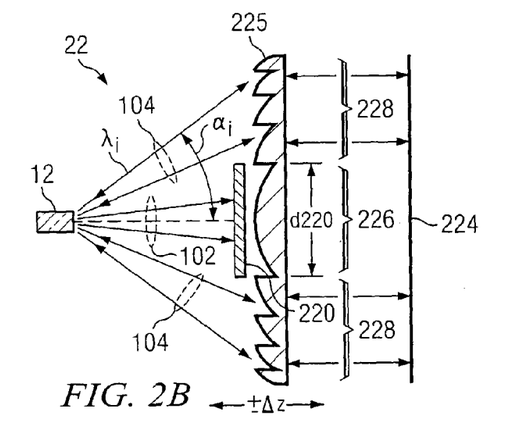

FIGS. 2A and 2B are cross-sectional views through the diameters of on-axis reflective and transmissive diffractive focusing elements 215 and 225, respectively, in external cavity lasers 21, 22, illustrating techniques in accordance with the invention to confine a greater amount of diffracted light to peripheral radial portions 218, 228 relative to central radial portions 216, 226 of diffractive focusing elements 215 and 225. Greater dispersivity advantageously reduces the instantaneous wavelength range of light that can propagate efficiently in external cavity laser 21, 22. This effective sharpening of the propagation efficiency as a function of wavelength occurs as a result of greater axial separation of focal distances as a function of wavelength separation. If the instantaneous wavelength range for efficient propagation falls within the emission spectrum of optical gain medium 12, non-linear gain characterizing the optical gain medium causes further narrowing of the instantaneous wavelength range of light emitted from optical gain medium 12 and efficiently propagating in the external cavity. The wavelength range for instantaneous propagation efficiency may then be tuned across the emission spectrum of optical gain medium 12, typically by mechanical tuning, to obtain an overall wavelength tuning range for external cavity laser 21, 22.

In accordance with the embodiments disclosed herein, central obscuration 210, 220, having respective diameter of d210, d220, prevents light from reaching central radial portion 216, 226 of respective diffractive focusing element 215, 225, such that diffractive focusing of light by diffractive focusing element 215, 225 back into optical gain medium 12 in either reflective or transmissive geometry is confined to peripheral radial portion 218, 228 of diffractive focusing element 215, 225. Thus, central obscuration 210, 220 each perform the function of confining diffractive focusing of light to peripheral radial portion 218, 228 of diffractive focusing element 215, 225. Exposed peripheral radial portion 218, 228 accordingly has a periphery inner diameter of d210, d220, equal to the corresponding obscuration diameter. Typically, central obscuration 210, 220 can function by directing incident light out of the external cavity, for example by any one or combination of absorption, reflection, diffraction, or refraction. Accordingly, central obscuration 210, 220 can be made of a material that is either opaque or transmissive over the operating wavelength range or of any substrate material with surface reflectivity over the operating wavelength range.

Since light incident on peripheral radial portion 218, 228 is diffracted through larger angles than light incident on and diffracted from central radial portion 216, 226 of diffractive focusing element 215, 225, peripheral radial portion 218, 228 of diffractive focusing element 215, 225 consequently causes more dispersion, and therefore enhanced wavelength tuning performance relative to central radial portion 216, 226 of diffractive focusing element 215, 225. Thus, central obscuration 210, 220 increases wavelength tuning performance by eliminating from external cavity laser 21, 22 those central light rays 102 undergoing less dispersion and confining diffractive focusing only to those light rays 104 undergoing greater dispersion on peripheral radial portion 218, 228 of diffractive focusing element 215, 225. However, this enhanced wavelength tuning performance is typically accompanied by a compromise of some overall propagation efficiency.

Alternative techniques to central obscuration 210, 220 may be used to enhance the wavelength tuning performance of external cavity lasers with diffractive focusing elements. Generally, any technique that confines diffractive focusing into the optical gain medium of light propagating in the cavity to the peripheral radial portion of the diffractive focusing element may provide this enhancement.

Figure 3:
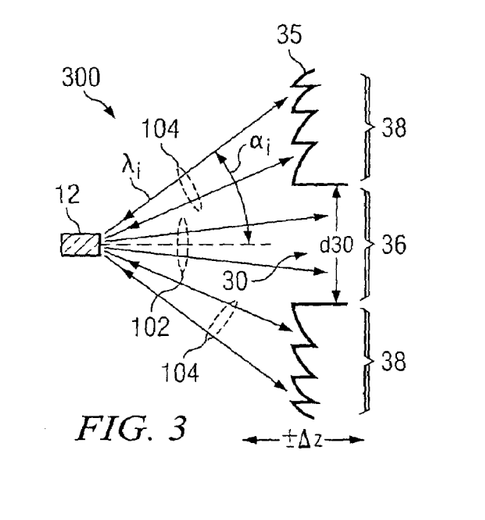
FIG. 3 is a cross-sectional view through the diameter of an on-axis reflective diffractive focusing element in an external cavity laser, illustrating the use of a central aperture to confine diffractive focusing to the peripheral radial portion of a diffractive focusing element, in accordance with the invention.

FIG. 3 is a cross-sectional view through the diameter of on-axis reflective diffractive focusing element 35 in external cavity laser 300, illustrating the use of central aperture 30 through central radial portion 36 of diffractive focusing element 35 to confine diffractive focusing to the peripheral radial portion of diffractive focusing element 35, in accordance with the invention. Central aperture 30 occupies substantially entire central radial portion 36 of diffractive focusing element 35 within periphery inner diameter d30. Light rays 104 emitted from optical gain medium 12 at large angles $\alpha_i$ are diffractively reflected with high dispersion from peripheral radial portion 38 of reflective diffractive focusing element 35 outside of periphery inner diameter d30 back into optical gain medium 12. On the other hand, light rays 102 emitted at small angles are not reflected at all from diffractive focusing element 35 within central radial portion 36, but simply pass through central aperture 30 of diameter d30 and are removed from external cavity 300, for example by any one or combination of absorption, reflection, diffraction, scattering, refraction, or further transmission at the opposite side of diffractive focusing element 35 relative to optical gain medium 12. Thus, central aperture performs the function of confining diffractive focusing of light to peripheral radial portion 38 of diffractive focusing element 35. A counterpart transmissive diffractive element with a central aperture can likewise be fabricated in a manner similar to reflective diffractive focusing element 35.

Figure 4:
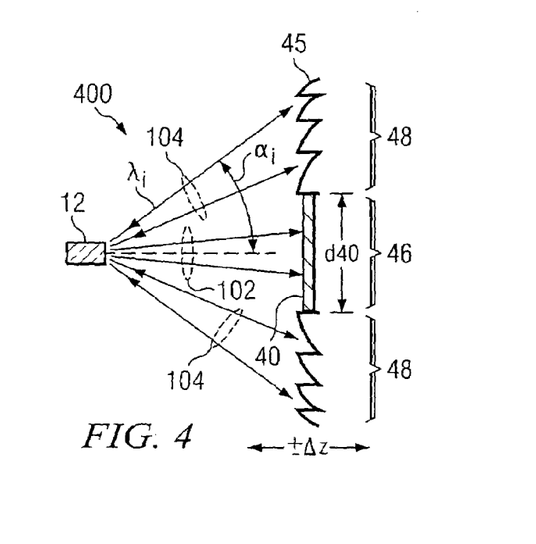
FIG. 4 is a cross-sectional view through the diameter of an on-axis reflective diffractive focusing element in an external cavity laser, illustrating the use of a central obscuration incorporated integrally into a diffractive focusing element, in accordance with the invention.

FIG. 4 is a cross-sectional view through the diameter of on-axis reflective diffractive focusing element 45 in external cavity laser 400, illustrating central obscuration 40 incorporated integrally into diffractive focusing element 45, in accordance with the invention. Light rays 104 emitted from optical gain medium 12 at large angles $\alpha_i$ are diffractively focused with high dispersion from the peripheral radial portion 48 of reflective diffractive focusing element 45 back into optical gain medium 12. On the other hand, light rays 102 emitted at small angles are not reflected at all from diffractive focusing element 45 within central radial portion 46, but are removed from external cavity 400, for example by any one or combination of absorption, reflection, diffraction, scattering, or refraction at central obscuration 40 of diameter d40 incorporated integrally into diffractive focusing element 45. Thus, central obscuration 40 performs the function of confining diffractive focusing of light to peripheral radial portion 48 of diffractive focusing element 45. Integrally incorporated central obscuration 40 may be formed as a reflectivity suppressing layer, for example by coating, painting, spraying, laminating, diffusing, depositing, epitaxially growing, or any appropriate fabrication technology. A counterpart transmissive diffractive element can likewise be integrally incorporated with a central obscuration in a manner similar to reflective diffractive focusing element 45.

Typically, an external cavity laser may additionally include other optical elements not shown in FIGS. 1–4, for example feedback elements, diffractive elements, wavelength selecting elements, mode selecting elements, focusing elements, collimating elements, and/or spatial filtering elements (see for example concurrently filed, co-pending and commonly assigned U.S. patent application Ser. No. 10/651,677, the disclosure of which has been incorporated herein by reference).

Figure 5:
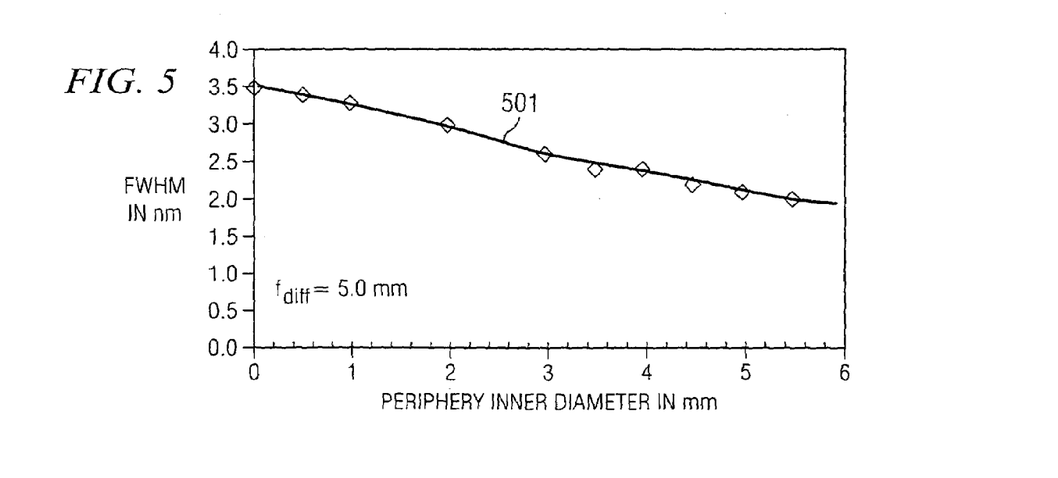
FIG. 5 is a graph illustrating an example of simulated FWHM in wavelength units of nanometers (nm) as a function of periphery inner diameter.

Periphery inner diameter, for example d210, d220, is typically selected by the system designer, based on performance requirements and design trade-offs. Useful measures of cavity wavelength tuning performance are cavity spectral and modal responses. Improved wavelength tuning performance is indicated by narrower cavity spectral response and, equivalently, fewer modes instantaneously propagating efficiently in the cavity. Spectral response is often characterized by the full width of the spectral response curve at its half maximum (FWHM). FIG. 5 is a graph illustrating an example of simulated FWHM in wavelength units of nanometers (nm) as a function of periphery inner diameter. For purposes of illustration, the nominal focal length $f_{diff}$ of diffractive element 215 is chosen to be 5 mm, and the overall diameter of diffractive element 215 is chosen to be 6.5 mm for the simulations. As expected, curve 501 shows that spectral response width FWHM narrows with increasing periphery inner diameter.

Figure 6:
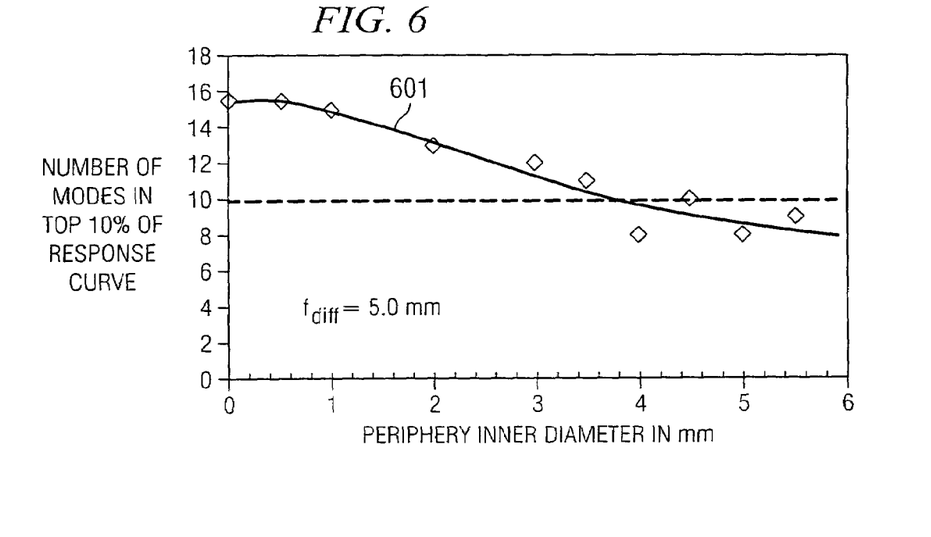
FIG. 6 is a graph illustrating the number of modes efficiently propagating in the cavity (the number of modes in the top 10 percent of the cavity modal response curve) as a function of periphery inner diameter.
Figure 7:
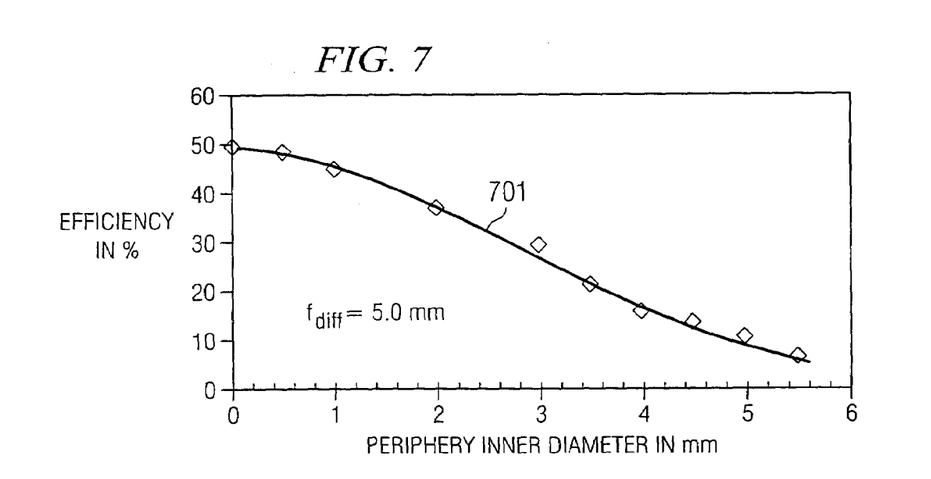
FIG. 7 is a graph illustrating propagation efficiency in the external cavity as a function of periphery inner diameter.

FIG. 6 is a graph illustrating the number of modes efficiently propagating in the cavity (the number of modes in the top 10 percent of the cavity modal response curve) as a function of periphery inner diameter. Again in this example, curve 601 shows that, as periphery inner diameter increases, the number of instantaneous modes efficiently propagating and, hence, instantaneously competing for resonance decreases. Both FIGS. 5 and 6 depict simulated performance for reflective diffractive geometry, as depicted in FIG. 1. FIG. 7 is a graph illustrating propagation efficiency in the external cavity as a function of periphery inner diameter. Curve 701 indicates the efficiency "fall-off" accompanying increasing of periphery inner diameter (and reduction of available surface area) of the diffractive focusing element. Efficiency falls to nearly zero, as periphery inner diameter approaches 6 mm, near the simulated limit of 6.5 mm set by the overall outer diameter of the diffractive focusing element.

Figure 8:
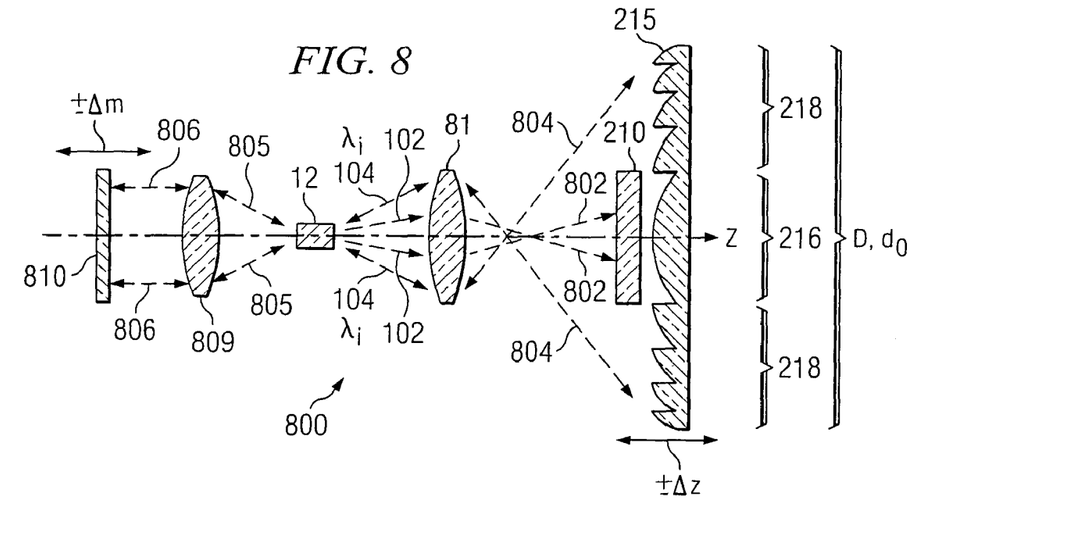
FIG. 8 is a cross-sectional view depicting a reflective geometry external cavity laser with central obscuration, combined with a relay focusing element, in accordance with the invention.

The wavelength tuning performance of an external cavity laser is further optionally enhanced by an optical relay element, which is described in concurrently filed, co-pending and commonly assigned U.S. patent application Ser. No. 10/651,737, the disclosure of which has been incorporated herein by reference. FIG. 8 is a cross-sectional view depicting reflective geometry external cavity laser 800 with central obscuration 210, combined with a relay focusing element, for example relay lens 81, in accordance with the invention. Relay lens 81 transforms light beam 102, 104 of wavelength $\lambda_i$ and low beam divergence emitted by optical gain medium 12 into expanded light beam 802, 804 of higher beam divergence, which, when incident on reflective diffractive focusing element 215, provides larger aperture filling of reflective diffractive focusing element 215. For example, filled aperture diameter $d_0$ can essentially cover overall diameter D. As a result, with expanded beam 802, 804, proportionally more light is incident on more dispersive peripheral radial portion 218 of diffractive focusing element 215. Without relay lens 81, light beam 102, 104 emitted by optical gain medium 12 may risk having insufficient beam divergence to access peripheral radial portion 218. In accordance with dispersion equation (2) above, dispersion increases toward the periphery of diffractive focusing element 215 for two reasons. First, the periodicity of the diffractive surface profile decreases toward the periphery; and second, the diffracted angle of light increases toward the periphery. Since dispersion increases with decreasing periodicity and with increasing diffracted angle, peripheral radial portion 218 is the most dispersive portion of diffractive focusing element 215. Consequently, peripheral radial portion 218 provides greater dispersion and therefore enables better wavelength tuning performance than does central radial portion 216.

Central obscuration 210 prevents light propagating in an inner cone, represented by light beams 102–802, from reaching central radial portion 216 of diffractive focusing element 215. Accordingly, light propagating in the inner cone, represented by light beams 102, 802, is prevented from being focused back into optical gain medium 12. Thus, diffractive focusing of light, represented in FIG. 8 by light beams 104, 804, back into optical gain medium 12 is confined to higher dispersivity peripheral radial portion 218, provided light beams 104, 804 have sufficient beam divergence to access peripheral radial portion 218. This increases the aggregate dispersivity of diffractive focusing element 215 and thereby enhances the wavelength tuning performance of external cavity laser 800. Exposed peripheral radial portion 218 accordingly has a periphery inner diameter equal to the corresponding diameter of central obscuration 210.

As described above, central obscuration 210 functions by directing incident light out of the external cavity, for example by any one or combination of transmission, absorption, reflection, diffraction, or refraction. The central obscuration is positioned on-axis in external cavity laser 800 proximate to central radial portion 216 of diffractive focusing element 215, or is alternatively fabricated integrally with diffractive focusing element 215. Optionally, central obscuration can be replaced functionally by a central aperture through central radial portion 216 of diffractive focusing element 215, through which transmitted light is directed out of the cavity. In a manner similar to that described above for reflective diffractive focusing element 215, an optical relay element can be combined with a transmissive diffractive focusing element, for example transmissive diffractive focusing element 225 depicted in FIG. 2B above.

Reflective geometry external cavity laser 800 utilizes a technique of modal tuning by adding focusing element 809 and movable tuning reflector 810. Light 102, 104 propagating within the cavity of external cavity laser 800 is partially transmitted through optical gain medium 12 as represented by rays 805, which are collimated by focusing element 809 onto tuning reflector 810 as represented by collimated rays 806. After reflection from tuning reflector 810, rays 805–806 retrace their propagation path through optical gain medium 12 into the cavity of external cavity laser 800. Modal tuning in reflective geometry external cavity laser 800 is accomplished by translating tuning reflector 810 parallel to the z-axis, as indicated by the direction arrows labeled ±Δm in FIG. 8. A counterpart technique of modal tuning for transmissive geometry external cavity lasers involves translating the primary reflector of the external cavity laser parallel to the z-axis, as depicted in FIG. 2B of above-mentioned U.S. patent application Ser. No. 10/651,737.

Displacing a diffractive focusing element off-axis to further increase the wavelength dispersion of light resonating within the cavity enhances the wavelength tuning performance of the external laser cavity. Additionally, by displacing the diffractive focusing element off-axis, light resonating within the cavity is incident on the off-axis diffractive focusing element twice as many times as on a corresponding on-axis diffractive focusing element.

Figure 9:
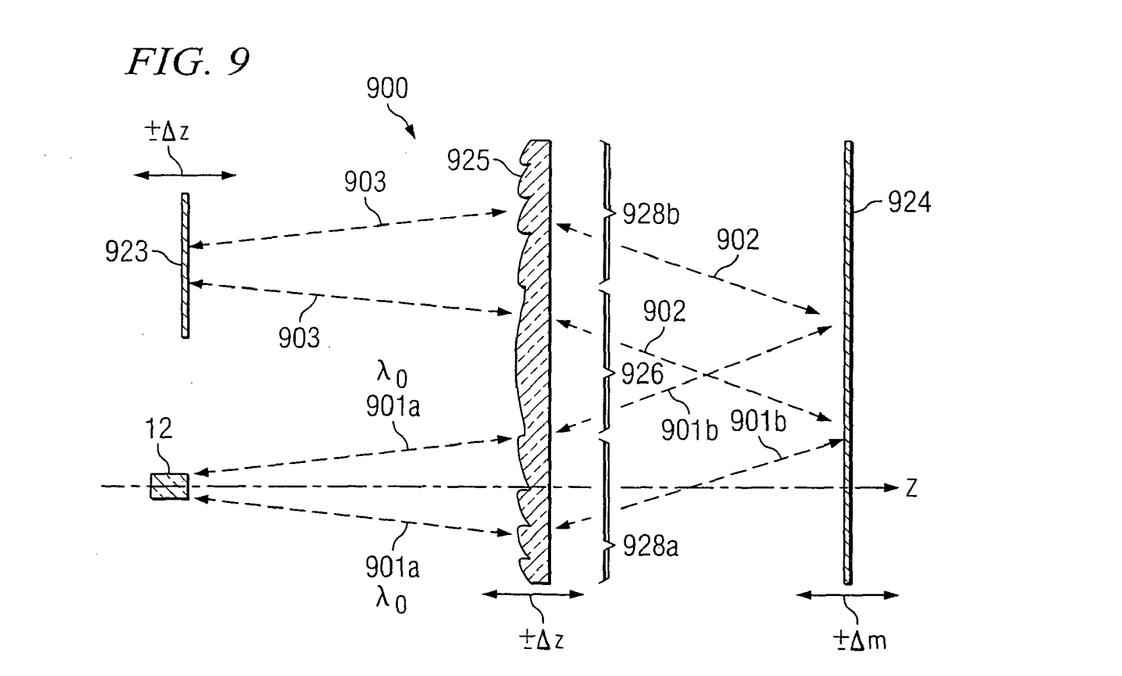
FIG. 9 is a cross-sectional view depicting cavity geometry and ray propagation in an external cavity laser in which a transmissive diffractive focusing element is displaced off-axis relative to the optical gain medium, in accordance with the invention.

FIG. 9 is a cross-sectional view depicting cavity geometry and ray propagation in external cavity laser 900 in which a transmissive diffractive focusing element is displaced off-axis relative to optical gain medium 12, in accordance with the invention. Optical gain medium 12 is capable of emitting light over a range of wavelengths, for example light rays 901a of wavelength $\lambda_0$. In the off-axis geometry depicted in FIG. 9, light rays 901a are emitted from optical gain medium 12, e.g., a laser diode, and are incident on segment 928a in the peripheral radial portion of diffractive focusing element 925, as shown in FIG. 9. This light is then collimated as light rays 901b, which are continuations of light rays 901a, by transmissive diffractive focusing element 925 and is reflected by primary reflector 924, for example a plane mirror, as light rays 902 back to segment 928b in the peripheral radial portion of transmissive diffractive focusing element 925. Segment 928b is a segment in transmissive diffractive focusing element 925 continuous with and angularly offset relative to segment 928a. Segment 928b focuses light rays 902 as light rays 903 onto secondary reflector 923, for example a plane mirror or retro-reflector. After reflection by secondary reflector 923, light that is resonant within cavity 900 retraces its path back to optical gain medium 12, as indicated by arrow heads on light rays labeled 901a through 903 in FIG. 9.

In accordance with the invention, in the off-axis cavity geometry and ray propagation of external cavity laser 900, light rays 901a–903 are directed onto angularly offset segments 928a, 928b in the peripheral radial portion and away from central radial portion 926 of transmissive diffractive focusing element 925. Thus, the off-axis displacement of transmissive diffractive focusing element 925 and secondary reflector 923 collectively perform the function of confining diffractive focusing of light to the peripheral radial portion of the diffractive focusing element. It will be recognized that, in off-axis cavity geometry 900, 1) more of the light emitted by optical gain medium 12 is incident on the peripheral radial portion of transmissive diffractive focusing element 925 relative to on-axis cavity geometry 11 (see FIG. 1B); and 2) light is diffracted by diffractive focusing element 925 four times instead of two times for on-axis cavity geometry 11. Accordingly, since dispersion is greater from the peripheral radial portion than from central radial portion 926 of transmissive diffractive focusing element 925, and moreover since twice as many passes of the light resonant in cavity 900 are incident on transmissive diffractive focusing element 925, off-axis cavity geometry 900 provides greater effective dispersion than does on-axis cavity geometry 11. These results are generally valid, independent of whether the external cavity laser contains a central obscuration (see FIGS. 2A–2B) or does not contain a central obscuration (see FIGS. 1A–1B).

Figure 10:
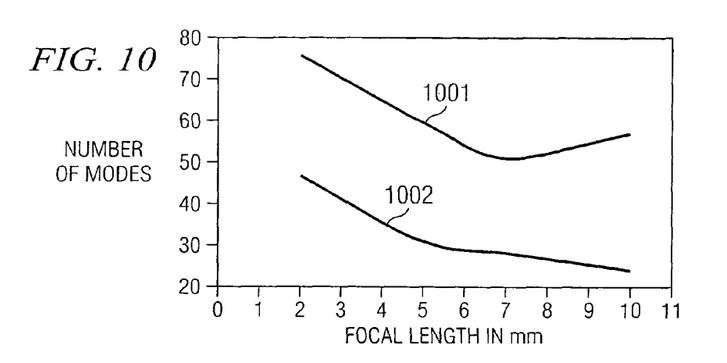
FIGS. 10 and 11 are graphs comparing simulated results of wavelength tuning performance of on-axis and off-axis diffractive cavity geometries.
Figure 11:
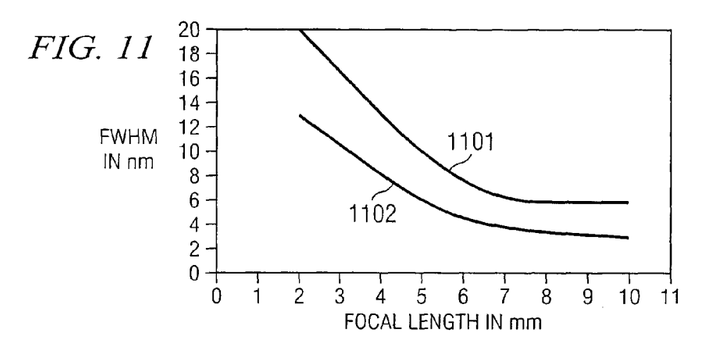

FIGS. 10 and 11 are graphs comparing simulated results of wavelength tuning performance of off-axis and on-axis diffractive cavity geometries. In FIG. 10, the number of resonant modes contained in the top 10 percent of cavity modal response is displayed as a function of focal length in millimeters (mm) of the diffractive focusing element. This is shown in curve 1001 for on-axis geometry and in curve 1002 for off-axis geometry. Enhanced wavelength tuning performance is evidenced by fewer resonating modes. Based on this criterion, the off-axis geometry provides enhanced wavelength tuning performance relative the on-axis geometry. FIG. 11 graphically represents the full width half maximum (FWHM) in nanometer (nm) wavelength units of the cavity spectral response as a function of diffractive focusing element focal length in mm in curve 1101 for on-axis cavity geometry and in curve 1102 for off-axis cavity geometry, in both cases without a central obscuration. A narrower cavity spectral response indicates enhanced wavelength tuning performance. Again, off-axis cavity geometry 900 exhibits enhanced wavelength tuning performance relative to on-axis cavity geometry 11. In performing the simulations, dimensions and offset chosen for the diffractive focusing element were dependent on focal length. For a focal length of 5 mm, the dimensions selected were 4.5 mm diameter, and a 0.3 mm offset relative to the optical axis was chosen.

Wavelength tuning in off-axis transmissive geometry 900 is accomplished by translating either transmissive diffractive focusing element 925 or secondary reflector 923 parallel to the z-axis in FIG. 9, as indicated by arrows labeled ±Δz. Modal tuning can be accomplished by translating primary reflector 924 parallel to the z-axis as indicated by arrows labeled ±Δm in FIG. 9.

Figure 12:
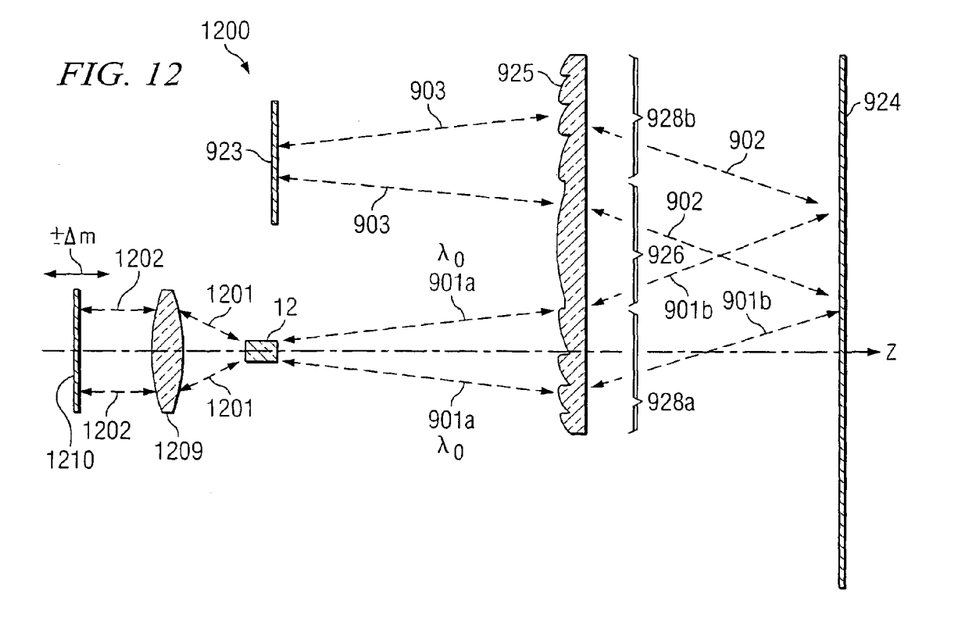
FIG. 12 is a cross-sectional view depicting an alternative technique of modal tuning by adding a focusing element and a movable tuning reflector.

FIG. 12 is a cross-sectional view depicting an alternative technique of modal tuning by adding focusing element 1209 and movable tuning reflector 1210. Light rays 901a–903 propagating within the cavity of external cavity laser 1200 are partially transmitted through optical gain medium 12 as light rays 1201, which are collimated by focusing element 1209 onto tuning reflector 1210 as collimated rays 1202. After reflection from tuning reflector 1210, light rays 1201–1202 retrace their propagation path through optical gain medium 12 into the cavity of external cavity laser 1200. Modal tuning in external cavity laser 1200 is accomplished by translating tuning reflector 1210 parallel to the z-axis, as indicated by the direction arrows labeled ±Δm in FIG. 12.

Figure 13:
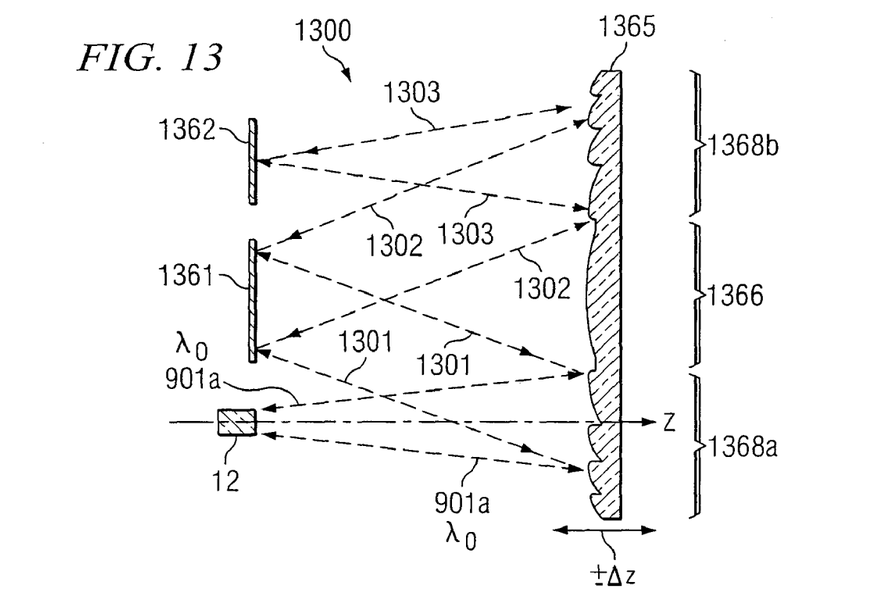
FIG. 13 is a cross-sectional view depicting an off-axis cavity geometry implemented with a reflective diffractive focusing element.

FIG. 13 is a cross-sectional view depicting off-axis cavity geometry 1300 implemented with reflective diffractive focusing element 1365. Again, more light, represented by light rays 901a, 1301–1303, reflects from peripheral radial portion segments 1368a, 1368b of off-axis reflective diffractive focusing element 1365 relative to on-axis cavity geometry 10 (see FIG. 1A). Additionally, there are twice as many diffractive reflections of light rays 901a, 1301–1303 in off-axis cavity geometry 1300 relative to on-axis cavity geometry 10. Thus, dispersion experienced by light rays 901a, 1301–1303 resonant within cavity 1300 is increased by displacing diffractive focusing element 1365 off-axis, and consequently cavity wavelength tuning performance is enhanced relative to on-axis cavity 10.

As described above, wavelength tuning in external laser cavity laser 1300 is accomplished traditionally by moving diffractive focusing element 1365 axially relative to gain medium 12, as indicated by directional arrows labeled ±Δz (see for example Bourzeis et al., U.S. Pat. No. 6,324,193, issued Nov. 27, 2001; also D. T. Cassidy et al., Modem Optics, Vol. 46, Section 7, 1999, pp. 1071–1078). Relative translation of the diffractive focusing element causes diffracted light of varying wavelengths to focus back into gain medium 12 and thereby to selectively resonate within external cavity laser 1300.

Figure 14:
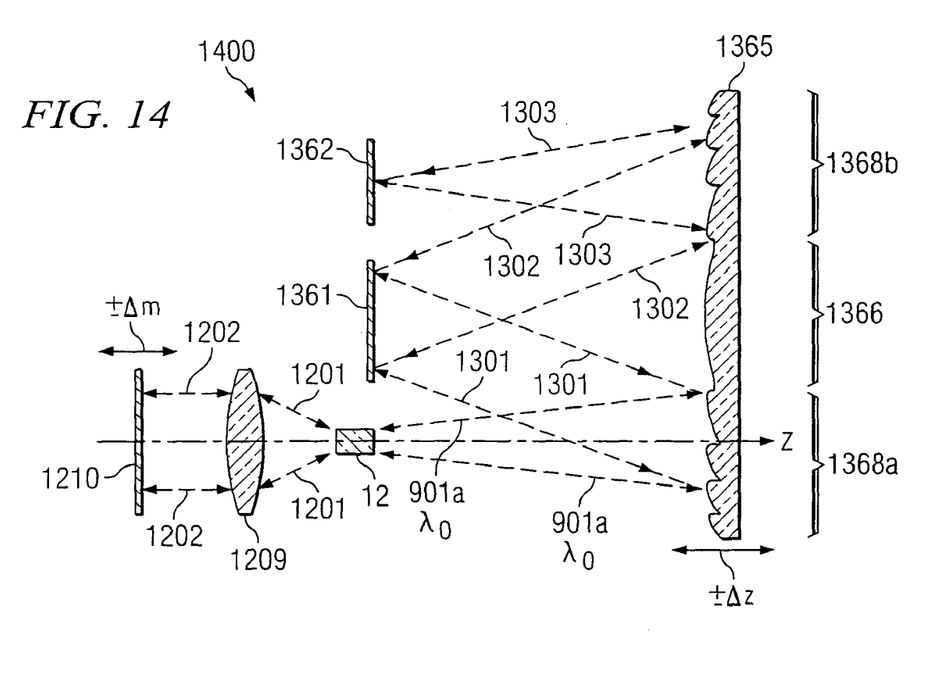
FIG. 14 is a cross-sectional view depicting an external cavity laser combining the reflective geometry external cavity depicted in FIG. 13 with the alternative technique of modal tuning depicted in FIG. 12.

FIG. 14 is a cross-sectional view depicting external cavity laser 1400 combining reflective geometry external cavity 1300 depicted in FIG. 13 with the alternative technique of modal tuning depicted in FIG. 12. Light 901a, 1301–1303 propagating within the cavity of external cavity laser 1400 is partially transmitted through optical gain medium 12 as rays 1201, which are collimated by focusing element 1209 onto tuning reflector 1210 as collimated rays 1202. After reflection from tuning reflector 1210, rays 1201–1202 retrace their propagation path through optical gain medium 12 into the cavity of external cavity laser 1400. Modal tuning in external cavity laser 1400 is accomplished by translating tuning reflector 1210 parallel to the z-axis, as indicated by the direction arrows labeled ±Δm in FIG. 14.

In both transmissive and reflective off-axis diffractive focusing element cavity designs, off-axis displacement causes astigmatism. Astigmatism is described in many optics textbooks (see for example E. Hecht, Optics, Second Edition, Addison-Wesley Publishing Company, 1990, pp. 226–228). Astigmatism occurs when off-axis light interacts with a spherical refractive lens or a circularly patterned diffractive focusing element. As a result, light propagating within two orthogonal planes will have different focal lengths. At each focal position, the light forms an elliptically shaped blur spot. This aberration is detrimental to the optical performance of the external laser cavity. In a refractive system, astigmatism can be corrected by changing the lens shape from spherical to ellipsoidal. Analogously, in a diffractive system astigmatism correction can be accomplished by modifying the diffractive microstructure (changing phase zones from circular to elliptical).

Figure 15A:
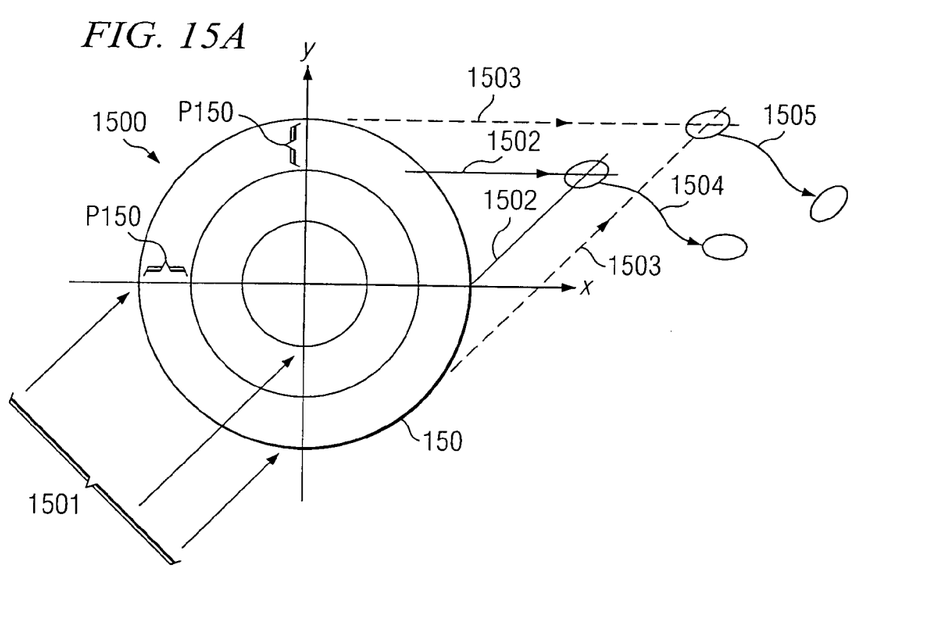
FIGS. 15A–15B are perspective views illustrating correction of astigmatism in an external cavity laser containing an off-axis diffractive focusing element, in accordance with the invention.
Figure 15B:
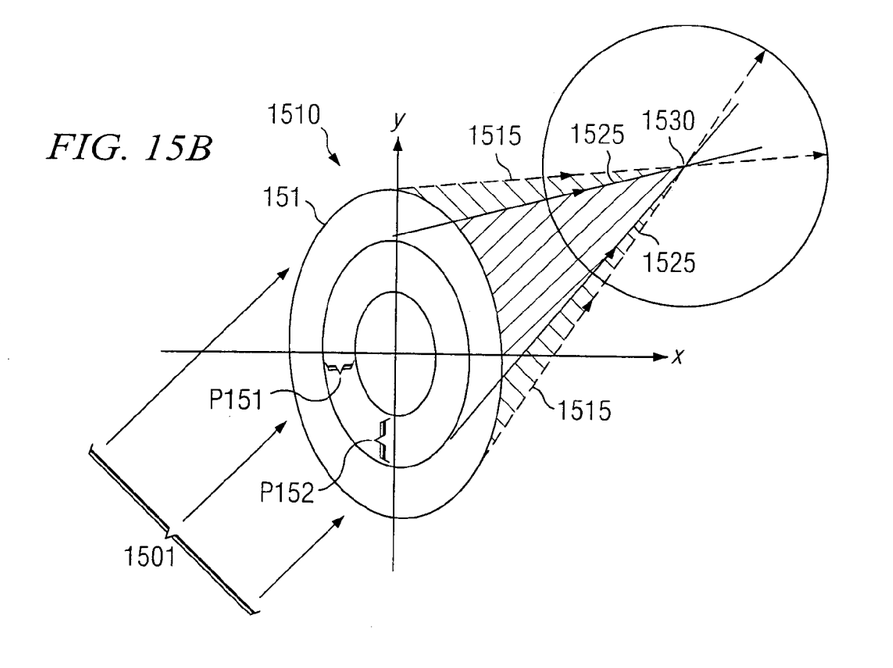

FIGS. 15A–15B are perspective views illustrating correction of astigmatism in an external cavity laser, for example external cavity laser 900, 1300, containing an off-axis diffractive focusing element, in accordance with the invention. FIG. 15A depicts external cavity laser 1500 including diffractive focusing element 150 uncorrected for astigmatism. Periodicity P150 is uniform in both x and y axes between adjacent circular phase zones. Off-axis light 1501 incident on diffractive focusing element 150 is diffractively focused at two different focal lengths, depending on in which of two orthogonal planes it is propagating. For example, light propagating in a plane containing the x-axis is diffractively focused into light beam 1502 converging to focal blur spot 1504, whereas light propagating within an orthogonal plane containing the y-axis is diffractively focused into light beam 1503 converging to focal blur spot 1505. The resulting aberration impairs the optical performance of external cavity laser 1500.

FIG. 15B depicts external cavity laser 1510 including diffractive focusing element 151 corrected for astigmatism. Periodicity P151 in the x-direction is different from periodicity P152 in the y-direction between adjacent elliptical phase zones. Incident off-axis light 1501 is diffractively focused by the elliptical structure of diffractive focusing element 151 at a single focal position. Light propagating in each of the two orthogonal planes is diffractively focused with a different diffractive periodicity P151, P152, thereby offsetting off-axis induced astigmatism. For example, light propagating in a plane containing the x-axis is diffractively focused into light beam 1515 converging to focal position 1530. Light propagating in an orthogonal plane containing the y-axis is diffractively focused into light beam 1525 also converging to focal position 1530. The resulting correction enhances the optical performance of external cavity laser 1510. Diffractive microstructure correcting astigmatism can be included on either reflective or transmissive surfaces.

What is claimed is:

1. A method of enhancing wavelength tuning performance in an external cavity laser, said method comprising:

providing a diffractive focusing element, said diffractive focusing element comprising portions of differing dispersivity;

emitting light into the cavity of said laser relative to an optical axis of said cavity;

diffractively focusing said light back onto said optical axis at a wavelength-dependent focal distance using said diffractive focusing element; and confining said diffractive focusing to a high dispersivity portion of said diffractive focusing element.

2. The method of claim 1 wherein said confining increases separation between said wavelength-dependent focal distances relative to diffractively focusing of said light without said confining.

3. The method of claim 1 wherein said confining comprises directing said light toward said high dispersivity portion.

4. The method of claim 3 wherein said confining comprises directing said light toward at least two angularly separated segments of said high dispersivity portion.

5. The method of claim 3 wherein said confining comprises directing said light, such that said directed light is incident at least four times on said high dispersivity portion.

6. The method of claim 3 wherein said directing comprises reflecting said light.

7. The method of claim 1 wherein said diffractively focusing comprises directing said light toward said high dispersivity portion.

8. The method of claim 7 wherein said directing comprises reflecting said light.

9. The method of claim 7 wherein said directing comprises transforming said emitted light from a beam of narrower beam divergence to a beam of wider beam divergence.

10. The method of claim 1 wherein said confining comprises offsetting said diffractive focusing element radially relative to said optical axis.

11. The method of claim 10 further comprising correcting said diffractive focusing element for astigmatism.

12. The method of claim 1 wherein said confining comprises confining said diffractive focusing to a portion of said light emitted into said cavity at emission angles greater than a threshold emission angle.

13. The method of claim 12 wherein said confining comprises transmitting through a central aperture in a diffractive focusing element a portion of said light emitted into said cavity at emission angles less than said threshold angle.

14. The method of claim 12 wherein said confining comprises selectively blocking a portion of said light emitted into said cavity at emission angles less than said threshold emission angle.

15. The method of claim 14 wherein said blocking comprises providing a central obscuration and disposing said obscuration proximate to said diffractive focusing element.

16. The method of claim 15 wherein said blocking comprises integrally incorporating said central obscuration into said diffractive focusing element.

17. The method of claim 1 wherein said diffractively focusing comprises reflectively diffractively focusing.

18. The method of claim 1 wherein said diffractively focusing comprises transmissively diffractively focusing.

* * * * *

UNITED STATES PATENT AND TRADEMARK OFFICE
CERTIFICATE OF CORRECTION

PATENT NO.         : 7,006,551 B2                                      Page 1 of 1
APPLICATION NO.    : 10/65747
DATED              : February 28, 2006
INVENTOR(S)        : Gruhike et al.

It is certified that error appears in the above-identified patent and that said Letters Patent is hereby corrected as shown below:

On the face page, in field (56), under "Other Publications", in column 2, line 2, after "MA," delete "p." and insert - - pp. - -, therefor.

On the face page, in field (56), under "Other Publications", in column 2, line 6, after "No. 7," delete "p." and insert - - pp. - -, therefor.

On the face page, in field (56), under "Other Publications", in column 2, line 11, delete "Pheripheral" and insert - - Peripheral - -, therefor.

Signed and Sealed this

First Day of August, 2006

JON W. DUDAS
*Director of the United States Patent and Trademark Office*

UNITED STATES PATENT AND TRADEMARK OFFICE
CERTIFICATE OF CORRECTION

PATENT NO. : 7,006,551 B2  Page 1 of 1
APPLICATION NO. : 10/651747
DATED : February 28, 2006
INVENTOR(S) : Gruhike et al.

It is certified that error appears in the above-identified patent and that said Letters Patent is hereby corrected as shown below:

On the face page, in field (56), under "Other Publications", in column 2, line 2, after "MA," delete "p." and insert - - pp. - -, therefor.

On the face page, in field (56), under "Other Publications", in column 2, line 6, after "No. 7" delete "p." and insert - - pp. - -, therefor.

On the face page, in field (56), under "Other Publications", in column 2, line 11, delete "Pheripheral" and insert - - Peripheral - -, therefor.

This certificate supersedes Certificate of Correction issued August 1, 2006.

Signed and Sealed this

Twelfth Day of September, 2006

JON W. DUDAS
*Director of the United States Patent and Trademark Office*